United States Patent
Fujiwara et al.

(10) Patent No.: US 11,404,115 B2
(45) Date of Patent: Aug. 2, 2022

(54) MEMORY WITH WRITE ASSIST SCHEME (71) Applicant: Taiwan Semiconductor Manufacturing Company, Ltd., Hsinchu (TW)

(72) Inventors: Hidehiro Fujiwara, Hsin-Chu (TW); Hung-Jen Liao, Hsin-Chu (TW); Yen-Huei Chen, Hsinchu County (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 17/084,635

(22) Filed: Oct. 30, 2020

(65) Prior Publication Data
US 2022/0139450 A1 May 5, 2022

(51) Int. Cl.
*G11C 11/419* (2006.01)
(52) U.S. Cl.
CPC .................... *G11C 11/419* (2013.01)
(58) Field of Classification Search
CPC .................................... G11C 11/419
USPC ............................................ 365/154
See application file for complete search history.

(56) References Cited

U.S. PATENT DOCUMENTS

| | | | | |
|---|---|---|---|---|
| 9,865,337 | B1* | 1/2018 | Ahmed | G11C 5/14 |
| 10,790,013 | B1* | 9/2020 | Dubey | G11C 11/412 |
| 2007/0183234 | A1* | 8/2007 | Han | G11C 11/413 |
| | | | | 365/203 |
| 2009/0235171 | A1* | 9/2009 | Adams | G11C 7/1096 |
| | | | | 715/723 |
| 2013/0286717 | A1* | 10/2013 | Adams | G11C 11/419 |
| | | | | 716/102 |
| 2019/0108872 | A1* | 4/2019 | Gupta | G11C 11/419 |
| 2019/0189197 | A1* | 6/2019 | Nii | G11C 11/419 |
| 2019/0258540 | A1* | 8/2019 | Sharon | G06F 11/1068 |

* cited by examiner

*Primary Examiner* — Sung Il Cho
(74) *Attorney, Agent, or Firm* — JCIPRNET (57) ABSTRACT

The disclosure introduces a write assist scheme that boost the word line of a selected memory cell by using a parasitic capacitor element coupled between the word line and a bit line of at least one unselected memory cell. The SRAM includes a word line, a first bit line, a second bit line, a first memory cell coupled to the first bit line and the word line, a second memory cell coupled to the second bit line and the word line, and a write assist circuit coupled to the second bit line. The write assist circuit is configured to clamp the second bit line to the word line during a write operation of the first memory cell.

20 Claims, 6 Drawing Sheets

MEMORY WITH WRITE ASSIST SCHEME

BACKGROUND

SRAM is a type of semiconductor memory typically used in computing applications requiring high-speed data access and low power consumption. For example, cache memory applications use SRAMs to store frequently-accessed data (e.g., data accessed by central processing units). Another application of SRAM may be image processing and system-on-chip (SOC) applications. SRAM has the advantageous feature of holding data without requiring a refresh. The SRAM's cell structure and architecture enable the high-speed data access. The SRAM cell includes a bi-stable flip-flop structure and transistors (e.g., pass gate transistors) that pass voltages from bit lines to the flip-flop structure. A typical SRAM architecture includes one or more arrays of memory cells and access circuitry. The memory cells of each SRAM array are arranged in rows and columns. Access to memory cells in a row is controlled by a word line. Data is written into (write operation) and read from (read operation) memory cells on bit lines. There is at least one bit line for each column of memory cells. The access circuitry includes address and driver circuits to access each of the SRAM cells via the word lines and bit lines.

DETAILED DESCRIPTION

The following disclosure provides many different embodiments, or examples, for implementing different features of the provided subject matter. Specific examples of components and arrangements are described below to simplify the present disclosure. These are merely examples and are not intended to be limiting. In addition, the present disclosure repeats reference numerals and/or letters in the various examples. This repetition is for the purpose of simplicity and clarity and, unless indicated otherwise, does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The following disclosure describes aspects of a static random access memory (SRAM). Specifically, the disclosure describes different embodiments related to an SRAM write operation. For ease of explanation, certain SRAM circuit elements and control logic are disclosed to facilitate in the description of the different embodiments. A person of ordinary skill in the art will understand that SRAMs also include other circuit elements and control logic. These other circuit elements and control logic are within the spirit and scope of this disclosure.

Figure 1:
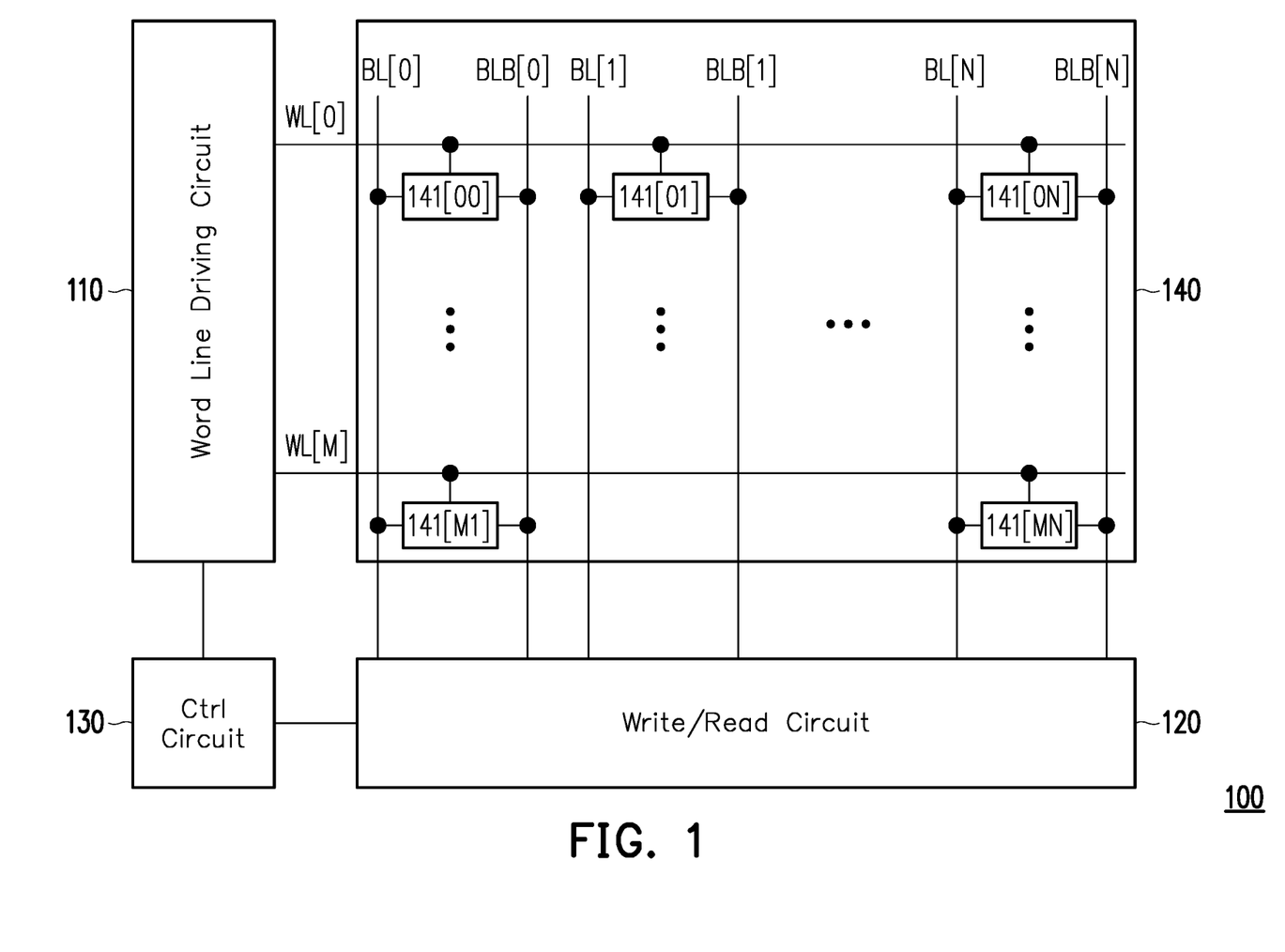
FIG. 1 is a diagram illustrating an SRAM with a write assist scheme according to some embodiments of the present disclosure.

FIG. 1 is a diagram illustrating an SRAM 100 with a write assist scheme according to some embodiments of the present disclosure. SRAM 100 may include a plurality of elements that enables the functionality of the SRAM such as write or read data from memory cell. In order to simplify the description, the SRAM 100 illustrated in FIG. 1 includes a word line driving circuit 110, a write/read circuit 120, a control circuit 130, and a memory array 140.

The memory array 140 includes a plurality of memory cells arranged in a plurality of rows and a plurality of columns. Each memory cell may be a six-transistor (6T), 8T, 10T cell and so on, which may include transistors and a bi-stable flip-flop structure. Each of the memory cells is coupled to a word line WL and a bit line pair BL/BLB. To simply the description, the memory array 140 may include "M" number of rows and "N" number of columns. The notation of 141[00] refers to a memory cell located in row"0", column "0". Similarly, the notation of 141[MN] refers to a memory cell located in row "M", column "M". Furthermore, the memory cells of the memory array 140 can be accessed by using a plurality of word lines WL[0]-WL[M] from the word line driving circuit 110 and a plurality of bit line pairs BL[0]/BLB[0]-BL[N]/BLB[N] from the write/read circuit 120. In the memory array 140, each memory cell stores one-bit data according to the corresponding word line WL and the corresponding bit line BL. The word line driving circuit 110 includes a plurality of word line drivers. Each word line driver may provide an individual word line signal WL to the corresponding memory cells in the memory array 140 according to a pre-decoding row address from the control circuit 130. According to information regarding address and command received by the SRAM 100, the control circuit 130 provide the pre-decoding addresses (e.g., address for row and columns) and a bit line signal. For example, in response to the received address, the control circuit 130 can provide a row address corresponding to the word lines of the memory array 140 and a column address corresponding to the bit lines of the memory array 140 to access the memory cells corresponding to the received address. According to the row and column address from the control circuit 130, the write/read circuit 140 provides a bit line signal (e.g., a voltage representing logic high or low) to the memory array 140, and the word line driving circuit 110 provides a word line signal (e.g., a voltage representing logic high or low) to the memory array 140. The voltage from the word line driving circuit 110 controls the transistor in the memory cell (e.g., pass-gate transistor) to pass voltages from the bit line pair BL/BLB to a bi-stable flip-flop structure in the memory cell. Therefore, in response to the word line signal and the bit line signal, data held in the corresponding memory cell(s) may be read from the corresponding memory cell(s) or written into the corresponding memory cell(s) in the memory array 140. A person of ordinary skill in the art would understand that SRAM 100 uses the bit line pair voltages to write data into a memory cell.

To write a memory cell, for example the memory cell 141[00], the control circuit 130 decodes the received address and transmits the row address and column address to the word line driving circuit 110 and the write/read circuit 120, respectively. The word line driving circuit 110 applies a word line voltage to the word line WL[0]. The write/read circuit 120 applies bit line voltages representing logic low (e.g., "0" or VSS) and logic high (e.g., "1" or VDD) to the bit line BL[0] and complementary bit line BLB[0], respectively. The term VSS may be referred to as a ground potential or a negative supply voltage to SRAM 100. The term VDD may refer to a positive supply voltage to SRAM 100 (e.g., 1.2V, 1.8V, 2.4, 3.3V, 5V, or any supply voltage defined by the SRAM 100.) The combination of the word line voltage and bit line voltages allows the memory cell 141[00] to be accessed (write operation or read operation.)

In writing operation, write margin degradation is induced by the bit line resistance. Voltage drops across the bit line introduced by the bit line resistance degrades the ability to write data into the memory cell of the SRAM 100. In the disclosure, a write assist circuit is included in the write/read circuit. The write assist circuit couples a bit line of unselected memory cell(s) connected to the same word line by utilizing the parasitic capacitance between the bit line of the unselected memory cell(s) and the word line. Detail of the SRAM with the write assist scheme would be described below.

Figure 2:
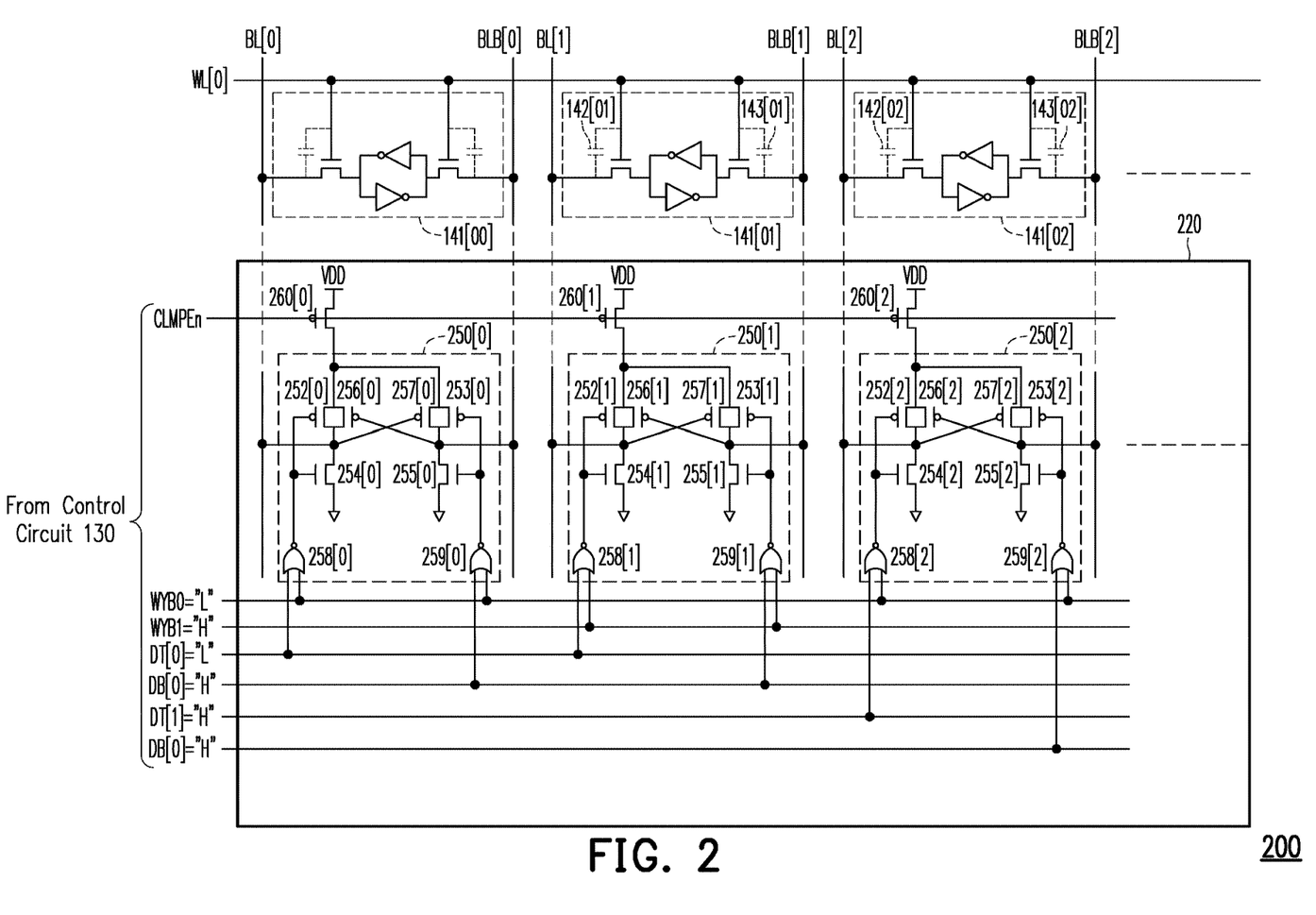
FIG. 2 is a diagram illustrating an SRAM with a write assist scheme according to some embodiments of the disclosure.

FIG. 2 is a diagram illustrating a SRAM 200 with write assist circuit 250 according to some embodiments of the disclosure. The SRAM 200 and SRAM illustrated in FIG. 1 include common elements such as a word line driving circuit 110 outputting the word line signal, a control circuit 130, and a memory array 140 including a plurality of memory cells 141[00]-141[NM] which are electrically coupled to the corresponding word line WL[0]-WL[M] and the corresponding bit line pairs BL[0]/BLB[0]-BL[N]/BLB[N]. These common elements operate in a similar manner as described above with respect to FIG. 1.

In the embodiments, the SRAM 200 further includes a write assist circuit 250 and a clamp circuit 260 in a write/read circuit 220. Each bit line pairs BL[0]/BLB[0]-BL[N]/BLB[N] is coupled to a write assist circuit 250[0]-250[N] and a clamp circuit 260[0]-260[N]. The clamp circuit 260 is coupled to the write assist circuit 250 and receives a clamp enable signal CLMPEn for the control circuit 130. Furthermore, the write assist circuit 250 also receives control signals WYB0, WYB1, DT[0], DB[0], DT[1], DB[1] from the control circuit 130. Based on the control signals WYB0, WYB1, DT[0], DB[0], DT[1], DB[1] and the clamp enable signal CLMPEn, the write assist circuit 250 is enabled to charge the corresponding bit lines.

The clamp circuit 260 enables the bit line of unselected bit line pair of at least one unselected memory cell to be clamped to the write line via the parasitic capacitance therebetween. This charge from the bit line pairs of the unselected memory cell(s) during the write operation would slightly boost the word line voltage, which results in a better write. Take a write operation to the memory cell 141[00] as an example, the control circuit 130 would output the clamp enable signal CLMPEn and the control signals WYB0, WYB1, DT[0], DB[0], DT[1], DB[1] to enable the write assist scheme after the activation of the word line of the selected memory cell. In detail, the bit line pairs BL[1]/BLB [1], BL[2]/BLB[2] of at least one unselected memory cell(s) 141[01], 141[02] connected to the same word line WL[0] as the memory cell 141[00] would be activated. The word line WL[0] would be pulled up through the parasitic capacitors 142[01], 143[01], 142[02], 143[02] of the unselected memory cells 141[01], 141[02]. As a result, the word line voltage on the word line WL[0] would be slightly boosted, which decreases the resistances of the pass gate transistors of the selected memory cell 141[00] for writing data into the memory cell 141 [00].

Figure 3:
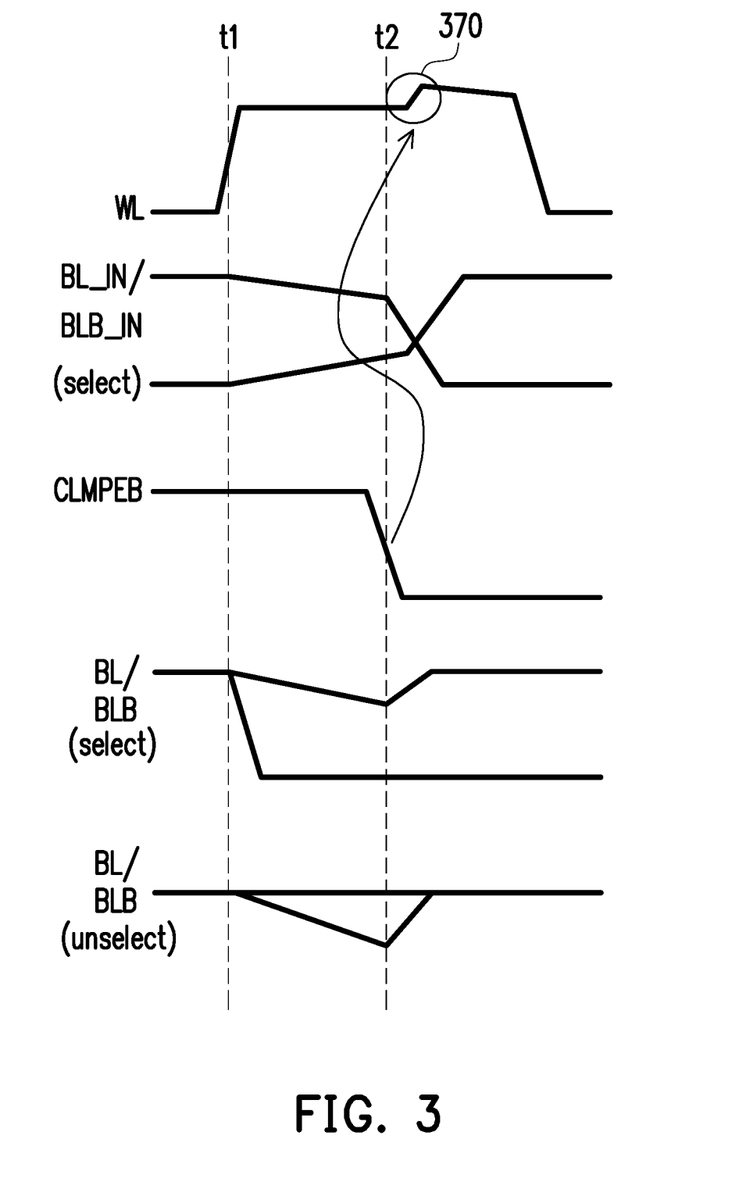
FIG. 3 is a timing diagram illustrating the boosting of the word line voltage for the selected memory cell according to some embodiments of the disclosure.

FIG. 3 is a timing diagram illustrating the boosting of the word line voltage for the selected memory cell 141 [00] according to some embodiments of the disclosure. At time t1, the word line of the selected memory cell is activated. At time t2, clamp enable signal CLMPEn is enabled which couples the bit line pair of the unselected memory cell(s) BL[1]/BLB[1] (and BL[2]/BLB[2]) to the word line WL[0] through the parasitic capacitors 142[01], 143[01] (and 142 [02], 143[02]) therebetween. The bit line pair of the unselected memory cell(s) 141[01] (141[02]) would be coupled to the supply voltage VDD coupled to the clamp circuit 260[1] (260[2]). Since the parasitic capacitors 142[01], 143[01] are already filled with charges, the activation of the clamp circuit 260 would move the charges toward the word line WL[0] After time t2, a boost 370 in the word line WL[0] would occur.

Referring back to FIG. 2, the structure of the clamp circuit and write assist circuit would be explained by using the clamp circuit 260[1] and the write assist circuit 250[1] coupled to the bit line pair BL[1]/BLB[1]. The structure of the clamp circuits 260[0], 260[2]-260[N] and the write circuit 250[0], 250[2]-250[N] coupled to the bit line pairs BL[0]/BLB[0], BL[2]/BLB[2]-BL[N]/BLB[N] would have similar configuration. The reference number would be simplified without the indication of the column number below for brevity. In the embodiments, the clamp circuit 260 is implemented by using a transistor, which is referred to as a clamp transistor below. The first terminal of the clamp transistor is coupled to the supply voltage VDD of the SRAM 200. The second terminal of the clamp transistor is coupled to the write assist circuit 250. The control terminal of the clamp transistor is coupled to the clamp enable signal from the control circuit 130. In the embodiments, the clamp transistor is a P-type transistor, and therefore, a logic low (e.g., "0" or VSS) from the control circuit 130 enables the clamp transistor, which couples the VDD coupled to the first terminal to write assist circuit 250. Although a P-type transistor is illustrated in FIG. 2 and used for explanation, the disclosure is not limited thereto, the type of transistor may be N-type depending on the design requirement.

The write assist circuit 250 includes a first transistor 252, a second transistor 253, a third transistor 254, a fourth transistor 255, a fifth transistor 256, a sixth transistor 257, a first NOR gate 258, and a second NOR gate 259. The first terminals of the first transistor 252 and the second transistor 253 are coupled to the supply voltage VDD. The second terminal of the first transistor 252 is coupled to the first terminal of the third transistor 254 and the control terminal of the sixth transistor 257, which forms a first common node coupled to the bit line BL. The second terminal of the third transistor 254 is coupled to a ground potential (e.g., VDD) of the SRAM 200. The control terminal of the first transistor 252 and the control terminal of the fifth transistor 256 are coupled to the output terminal of the first NOR gate 258. The first and second terminals of the fifth transistor 256 are respectively coupled to the first and second terminals of the first transistor 252. The control terminal of the fifth transistor 256 is coupled to the second terminal of the second transistor 253. The first and second terminals of the sixth transistor 257 are respectively coupled to the first and second terminals of the second transistor 253. The fifth and sixth transistors 256, 257 form a cross coupled pair transistor. The second terminals of the second and sixth transistors 253, 257 are further coupled to the first terminal of the fourth transistor 255 at which a second common node is formed. The second common node is coupled to the complementary bit line BLB. The second terminal of the fourth transistor 255 is coupled to the ground potential (e.g., VDD) of the SRAM 200. The control terminal of the second transistor 253 and the control terminal of the fourth transistor 255 are coupled to the output terminal of the second NOR gate 259.

In the embodiment, the inputs of the first and second NOR gates 258, 259 are coupled to the control signals from the control circuit 130, as to enable or disable the write assist circuit 250. For the write assist circuit 250[1] coupled to the first column corresponding to the bit line pair BL[1]/BLB [1], the first input of the first NOR gate 258 is coupled to the third control signal DT[0] (which would have low potential, "L"), and the second input of the first NOR gate 258 is coupled to the second control signal WYB1 (which would have high potential, "H"). On the complementary bit line BLB[1], the first input of the second NOR gate 259 is coupled to the forth control signal DB[0] (which is would have high potential, "H"), and the second input of the second NOR gate 259. In the embodiments, the clamp enable signal CLMPEn coupled to the clamp circuit 260 enables the write assist circuit 250. According to the control signals WYB0, WYB1, DT[0], DB[0], DT[1], DB[1], the write assist circuit 250 couples the VDD coupled to the first terminals of the clamp circuit 260 to the corresponding bit lines BL/BLB. In detail, to clamp the bit line of the unselected memory cell (e.g., memory cell(s) 141[01], 141[02]) to the word line of the selected memory cell (e.g., memory cell 140[00]), the first control signal WYB0 would be at low potential (i.e., "L"), the second control signal WYB1 would be at high potential (i.e., "H"), the third control signal DT[0] would be at low potential, and the fourth, fifth and sixth control signals DB[0], DT[1], DB[1] would be at high potential. It should be noted that the logic or potential of the control signals may be reversed depending on the design of the circuit.

In one of the embodiments, the control signals WYB0, WYB1, DT[0], DB[0], DT[1], DB[1] are signals used to enable the write assist circuit(s) for claiming bit line(s) of unselected cell to word line of the selected cell. In some embodiments, other components such as an inverter may be coupled between the control signals and the bit lines, the embodiment is not intended to limit the connection thereto. In the embodiments, the control signals WYB0, WYB1 may be generated by a timing logic in the control circuit 130. The control signals DT[0], DB[0], DT[1], DB[1] may be generated by a logic circuit in the control circuit 130 or the write/read circuit 120 according to data input.

Figure 5:
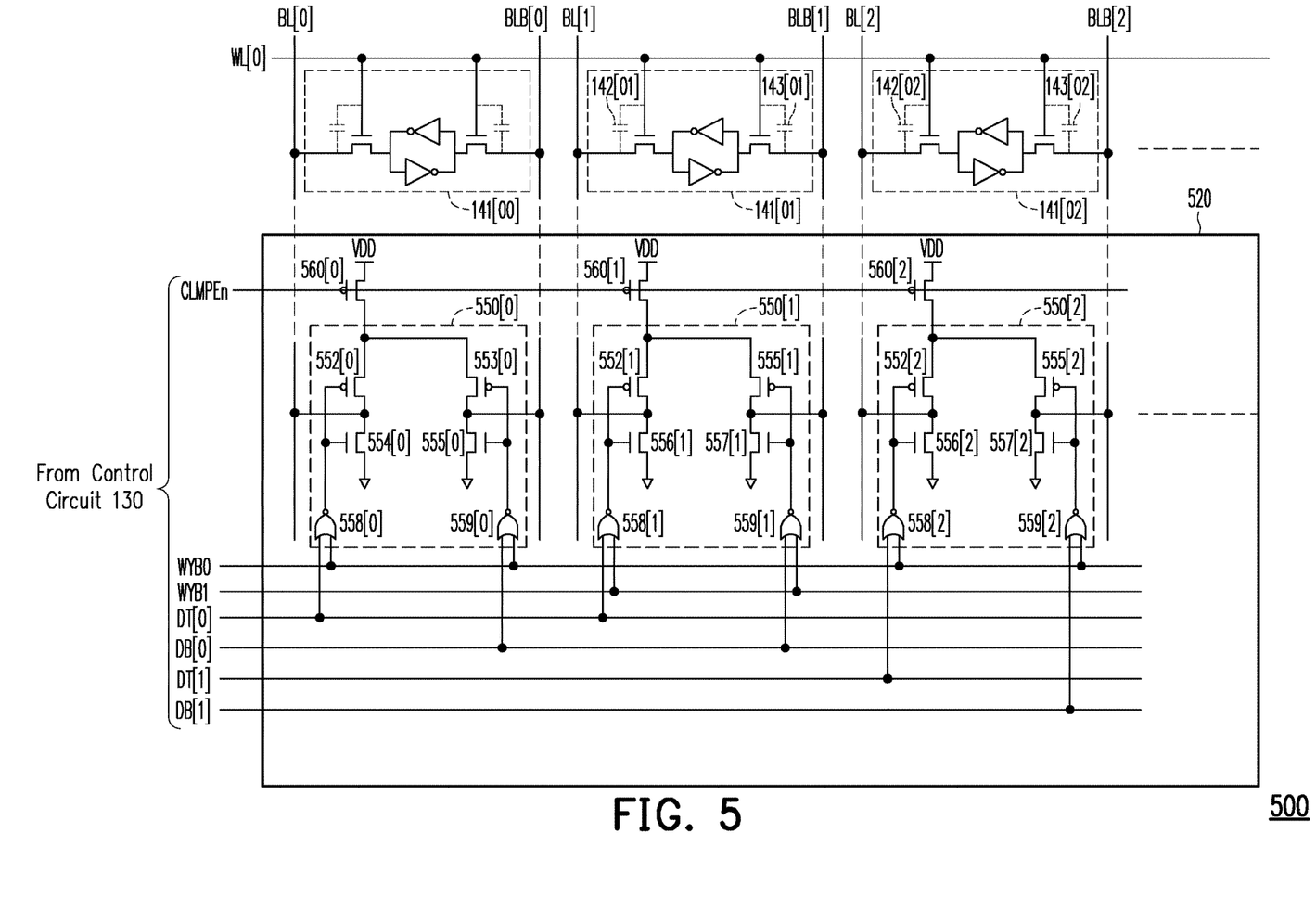
FIG. 5 is a diagram illustrating an SRAM with a write assist scheme according to some embodiments of the disclosure.

In the embodiments, the first, second, fifth, and sixth transistors 252, 253, 256, 257 are different type of transistor with respect to the third and fourth transistors 254, 255. As illustrated in FIG. 5, the first, second, fifth, and sixth transistors 252, 253, 256, 257 are P-type transistors, and the third and fourth transistors 254, 255 are N-type transistors. The disclosure is not intended to limit the type of the transistors. A person of ordinary skill in the art would recognize that the type of transistor may be changed between N-type and P-type according to the design requirement of the circuit.

Based on the above, the write line voltage applied to the write line WL[0] may be boosted by coupling the bit lines of the unselected memory cell(s). This effectively decreases the resistances reside in the bit line of the selected memory cell for write operation by reducing the resistance of the gate pass transistor of the selected memory cell. In other words, an increase of the word line voltage applied to the control terminal of the gate pass transistor would allow more electrons (charge) to pass, which reduces the bit line resistance caused by the gate pass transistor.

Figure 4:
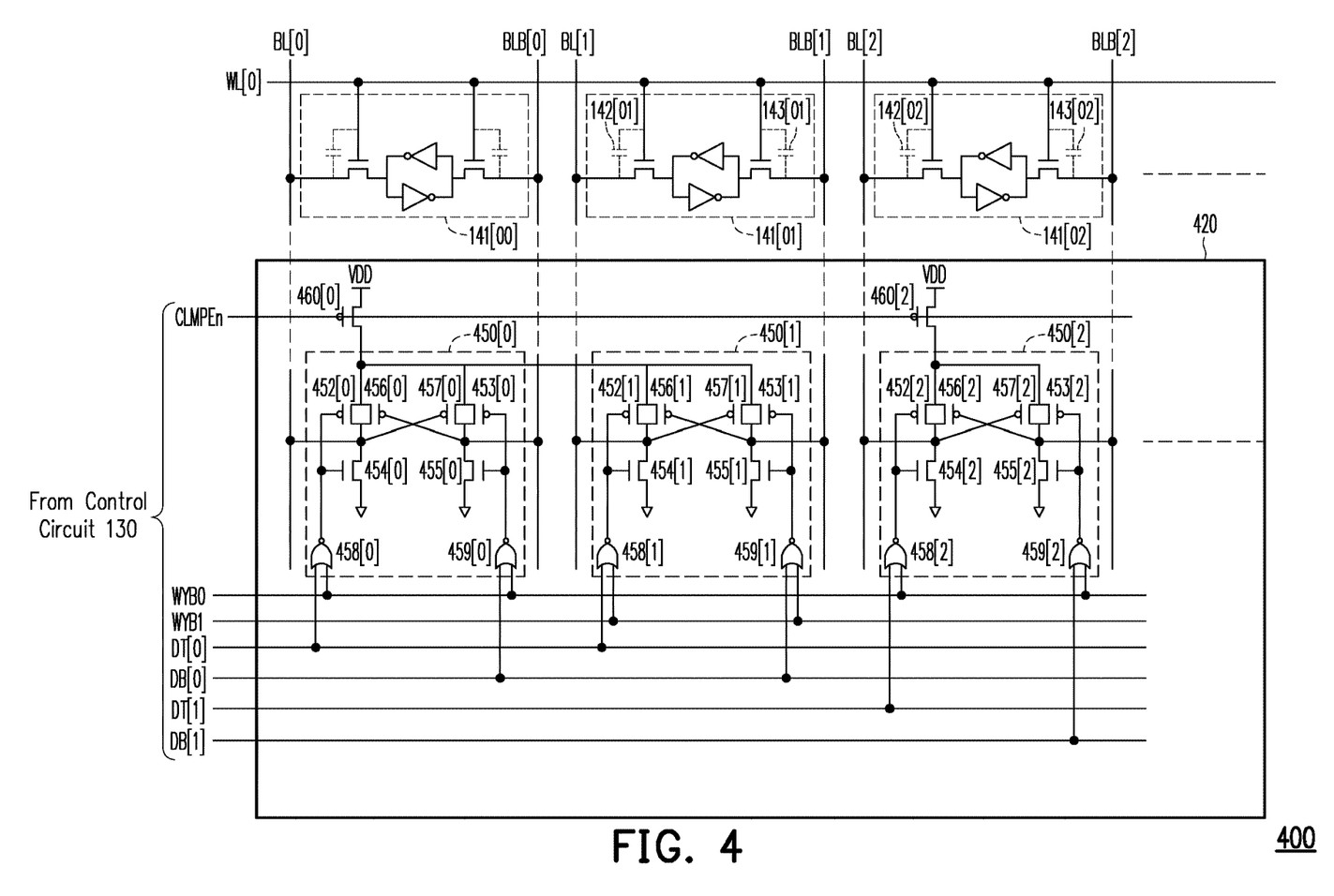
FIG. 4 is a diagram illustrating an SRAM with a write assist scheme according to some embodiments of the disclosure.

FIG. 4 is a diagram illustrating a SRAM 400 with write assist circuit 250 according to some embodiments of the disclosure. The SRAM 400 and SRAM 200 illustrated in FIG. 2 include common elements such as a word line driving circuit 110 outputting the word line signal, a control circuit 130, and a memory array 140 including a plurality of memory cells 141[00]-141[NM] which are electrically coupled to the corresponding word line WL[0]-WL[M] and the corresponding bit line pairs BL[0]/BLB[0]-BL[N]/BLB [N]. These common elements operate in a similar manner as described above with respect to FIG. 1.

The SRAM 400 decreases the number of the clamp circuits. Instead of having one clamp circuit for each bit line pair BL[0]/BLB[0]-BL[N]/BLB[N], multiple write assist circuits 450[0]-450[N] may be activated by one clamp circuit 460. With reference to FIG. 4, the SRAM 400 may share a clamp circuit 460[0] for the write assist circuits 450[0], 450[1], a clamp circuit 460[1] for the write assist circuits 450[2], 450[3], and so on. For example, the control circuit 130 receives a commend for accessing the memory cell 141[02], the control circuit 130 may enable the write assist circuits 450[0], 450[1] according to the clamp circuit 460[0], so as to clamp the bit lines of the unselected memory cells 141[0], 141[1] to the write line WL[0] to which the selected memory cell 141[2] is coupled. This reduces the layout area of the clamp circuit 460, since more than one write assist circuits 460[0]-460[N] can be activated via one clamp circuit 450. Although the embodiments illustrated in FIG. 4 shows that one clamp circuit may be shared for activating two write assist circuit, the disclosure is not intended to limited the number of write assist circuits a clamp circuit may activate. In other embodiments of the disclosure, one clamp circuit may be used to activate any number (such as 2, 3, 4 and so on) of the write assist circuits.

FIG. 5 is a diagram illustrating a SRAM 500 with write assist circuit 250 according to some embodiments of the disclosure. The SRAM 400 and SRAM 200 illustrated in FIG. 2 include common elements such as a word line driving circuit 110 outputting the word line signal, a control circuit 130, and a memory array 140 including a plurality of memory cells 141[00]-141[NM] which are electrically coupled to the corresponding word line WL[0]-WL[M] and the corresponding bit line pairs BL[0]/BLB[0]-BL[N]/BLB [N]. These common elements operate in a similar manner as described above with respect to FIG. 1. The SRAM 500 includes a write/read circuit 520, where the cross-coupled transistors formed by the second and third transistors 253, 254 as illustrated in the embodiment of FIG. 2 may be removed for further reduce the layout area of the write assist circuits 550[0]-550[N]. As compared to the embodiment of FIG. 2, each of the write assist circuits 550[0]-550[N] includes four transistors 552, 555, 556, 557 and two NOR gates 558, 559.

With reference to FIG. 5, each of the write assist circuits 550[0]-550[N] is still enabled by the clamp circuits 560[0]-560[N]. The clamp circuits 560[0]-560[N] are coupled between the supply voltage VDD and the write assist circuit 550[0]-550[N]. The clamp enable signal CLMPEn turns on the clamp circuits 560[0]-560[N], where the supply voltage VDD is coupled to the write assist circuit 550[0]-550[N]. In detail, the first terminal of the transistor 552 (may also be referred to as a first transistor) and the first terminal of the transistor 553 (may also be referred to as a second transistor) are coupled to the clamp circuit 560 for receiving the supply voltage VDD. The second terminal of the transistor 552 is coupled to the first terminal of the transistor 554 (may also be referred to as the third transistor) and the bit line BL. The control terminals of the transistors 552, 554 are coupled to the output terminal of the NOR gate 556 (also referred to as a first NOR gate). The second terminal of the transistor 554 is coupled to the ground potential of the SRAM 400 (e.g., VSS.) On the complementary bit line side, the second terminal of the transistor 553 is coupled to the first terminal of the transistor 555 (may also be referred to as the fourth transistor) and the complementary bit line BLB. The second terminal of the transistor 555 is coupled to the ground potential of the SRAM 400. The control terminals of the transistors 553, 555 are coupled to the output terminal of the NOR gate 559 (also referred to as a second NOR gate.) In the embodiment, the inputs of the first and second NOR gates 558, 559 are coupled to the control signals WYB0, WYB1, DT[0], DB[0], DT[1], DB[1] from the control circuit 130, as to enable or disable the write assist circuit 250. The clamp enable signal CLMPEn coupled to the clamp circuit 560 enables the write assist circuit 550, and the control signals WYB0, WYB1, DT[0], DB[0], DT[1], DB[1] activates the transistors in the write assist circuit 550 for coupling the supply voltage VDD to the corresponding bit lines.

In the embodiments, the transistors 552, 553 are different type of transistor with respect to the transistor 554, 555. As illustrated in FIG. 5, the transistors 552, 553 are P-type transistors, and the transistors 554, 555 are N-type transistors. A person of ordinary skill in the art would recognize that the type of transistor may be changed between N-type and P-type according to the design requirement of the circuit.

Figure 6:
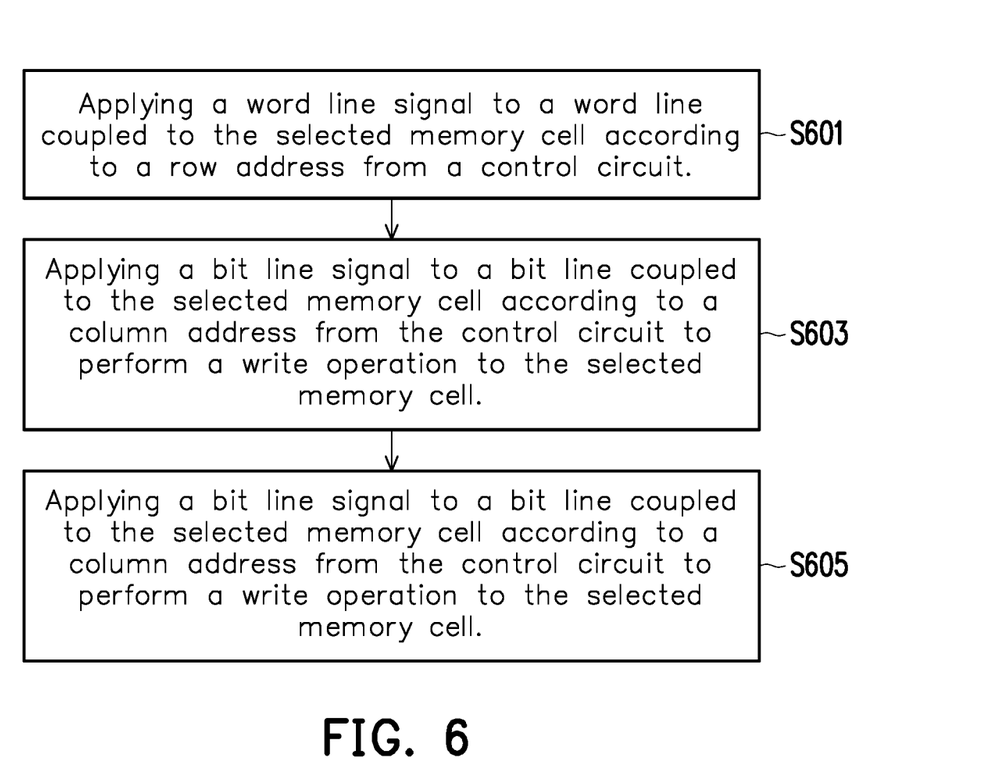
FIG. 6 is flow diagram illustrating a process of writing a memory cell (selected memory) according to some embodiments of the disclosure.

FIG. 6 is flow diagram illustrating a process of writing a memory cell (selected memory) according to some embodiments of the disclosure. In embodiments, a command is received for performing a write operation to a selected memory cell. As described above, the control circuit 130 would decode the commend and generates a row address for the word line driving circuit and a column address for the write/read circuit. In step 601, a word line signal is applied to a word line coupled to the selected memory cell according to the row address received from the control circuit. Next, in step S603, a bit line signal is applied to a bit line corresponding to the selected memory cell according to a column address from the control circuit to perform a write operation to the selected memory cell. In step S605, a clamp enable signal is applied from the control circuit to clamp other bit lines coupled to an unselected memory cell to the word line coupled to the selected memory cell to provide a voltage boost to the word line. In the embodiments, the unselected memory cell is coupled to the same word line as the selected memory cell. The clamp enable signal couples a supply voltage to the other bit lines coupled to the unselected memory cell. Then, the word line coupled to the selected memory cell is pulled up due to parasitic capacitor element coupled between the word line and the other bit line coupled to the unselected memory cell. Since the supply voltage is coupled to the other bit line, one end of there parasitic capacitor element between the word line and the other bit line would be pulled up. In other embodiments, a control signal applied from the control circuit to the write assist circuit in the write/read circuit to select a portion of other bit lines to clamp to the word line coupled to the selected memory cell.

In accordance with some embodiments of the disclosure, a memory device includes a word line, a first bit line, a second bit line, a first memory cell coupled to the first bit line and the word line, a second memory cell coupled to the second bit line and the word line, and a write assist circuit coupled to the second bit line. The write assist circuit is configured to clamp the second bit line to the word line during a write operation of the first memory cell.

In accordance with some embodiments of the disclosure, a memory device includes a memory array, a word line driving circuit, and a write/read circuit. The memory array includes a plurality of memory cells, a plurality of word lines and a plurality of bit lines, and each memory cells is coupled to one of the word lines and one of the bit lines. The word line driving circuit is coupled to the memory array, and configured to output a word line signal to one of the word line corresponding to a selected memory cell for performing a write operation to the selected memory cell. The write/read circuit is coupled to the memory array, and configured to apply a write voltage to one of the bit line corresponding to the selected memory cell, and clamping other bit line corresponding to an unselected memory cell to the word line corresponding to the selected memory cell.

In accordance with some embodiments of the disclosure, a method of writing a selected memory cell is provided. The method includes a step of applying a word line signal to a word line coupled to the selected memory cell according to a row address from a control circuit, a step of applying a bit line signal to a bit line coupled to the selected memory cell according to a column address from the control circuit to perform a write operation to the selected memory cell, and a step of applying a clamp enable signal from the control circuit to clamp other bit lines coupled to an unselected memory cell to the word line coupled to the selected memory cell to provide a voltage boost to the word line.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory device, comprising:
   a word line;
   a first bit line and a second bit line;
   a first memory cell, coupled to the first bit line and the word line;
   a second memory cell, coupled to the second bit line and the word line; and
   a write assist circuit, coupled to the second bit line, and configured to couple the second bit line to the word line through a parasitic capacitor of the second memory cell during a write operation of the first memory cell.

2. The memory device of claim 1, further comprises:
   a clamp circuit, having a control terminal coupled to a control circuit, a first terminal coupled to a supply voltage and a second terminal coupled to the write assist circuit, wherein during the write operation of the first memory cell, the clamp circuit is activated to pass the supply voltage to the write assist circuit according to a clamp enable signal received from the control circuit.

3. The memory device of claim 2, wherein the activation of the clamp enable signal is after an output of a word line signal to the word line for performing the write operation to the first memory cell.

4. The memory device of claim 1, wherein the memory device further comprises:
a third bit line; and
a third memory cell, coupled to the third bit line and the word line,
wherein the write assist circuit comprises:
    a first write assist circuit coupled to the second bit line, and configured to clamp the second bit line to the word line during the operation of the first memory cell; and
    a second write assist circuit coupled to the third bit line, and configured to clamp the third bit line to the word line during the write operation of the first memory cell.

5. The memory device of claim 4, further comprises:
a first clamp circuit, having a control terminal coupled to a control circuit, a first terminal coupled to a supply voltage and a second terminal coupled to the first write assist circuit; and
a second clamp circuit, having a control terminal coupled to the control circuit, a first terminal coupled to the supply voltage and a second terminal coupled to the second write assist circuit,
wherein the during the write operation of the first memory cell, the first and second clamp circuits are activated to pass the supply voltage to the first and second write assist circuits respectively coupled to the second and third bit lines according to a clamp enable signal received from the control circuit.

6. The memory device of claim 4, further comprises:
a clamp circuit, having a control terminal coupled to a control circuit, a first terminal coupled to a supply voltage and a second terminal coupled to the first and second write assist circuits, wherein during the write operation of the first memory cell, the clamp circuit is activated to pass the supply voltage to the second and third bit lines, respectively, through the first and second write assist circuits according to a clamp enable signal received from the control circuit.

7. The memory device of claim 1, wherein the first write assist circuit is configured to clamp the second bit line to the word line through a parasitic capacitor element between the second bit line and the word line by using a supply voltage of the memory device.

8. The memory device of claim 1, wherein the write assist circuit comprises:
a first transistor, having a first terminal coupled to the supply voltage, a second terminal coupled to the first bit line, and a control terminal coupled to a control signal received from the control circuit;
a second transistor, having a first terminal coupled to the supply voltage, a second terminal coupled to a first complementary bit line connected to the first memory cell, and a control terminal coupled to the control signal received from the control circuit;
a third transistor, having a first terminal coupled to the first bit line, a second terminal coupled to a ground potential of the memory device, and a control terminal coupled to the control signal received from the control circuit; and
a fourth transistor, having a first terminal coupled to the first complementary bit line, a second terminal coupled to the ground potential, and a control terminal coupled to the control signal received from the control circuit.

9. The memory device of claim 8, wherein the write assist circuit further comprises:
a fifth transistor and a sixth transistor forming a cross coupled pair, wherein a first terminal of the fifth transistor and a first terminal of the fifth transistor are coupled of the supply voltage, a control terminal of the fifth transistor is coupled to a second terminal of the sixth transistor which is coupled to the first complementary bit line, and a control terminal of the sixth transistor is coupled to a second terminal of the fifth transistor which is coupled to the first bit line.

10. A memory device, comprising:
a memory array, having a plurality of memory cells, a plurality of word lines and a plurality of bit lines, wherein each memory cells is coupled to one of the word lines and one of the bit lines;
a word line driving circuit, coupled to the memory array, and configured to output a word line signal to one of the word line corresponding to a selected memory cell for performing a write operation to the selected memory cell;
a write/read circuit, coupled to the memory array, and configured to apply a write voltage to one of the bit line corresponding to the selected memory cell, and clamping a supply voltage to other bit line corresponding to an unselected memory cell as to provide a voltage boost to the word line corresponding to the selected memory cell and the unselected memory cell.

11. The memory device of claim 10, wherein the unselected memory cell is coupled to the same word line as the selected memory cell.

12. The memory device of claim 10, wherein the clamping of the other bit line corresponding to the unselected memory cell to the word line corresponding to the selected memory cell through a parasitic capacitor element between the other bit line and the word line.

13. The memory device of claim 10, wherein the write/read circuit comprises:
a clamp circuit, having a first terminal coupled to the supply voltage and a second terminal coupled to a control circuit, and configured to pass the supply voltage to a third terminal according to a clamp enable signal from the control circuit; and
a write assist circuit, having a first terminal coupled to the third terminal of the clamp circuit, a second terminal coupled to the other bit line corresponding the unselected memory cell, and a third terminal coupled to control signal received from the control circuit, and configured to couple the supply voltage to the bit line of the unselected memory cell according to the control signal.

14. The memory device of claim 13, wherein the write assist circuit includes a first write assist circuit coupled to a first bit line corresponding to a first unselected memory cell and a second write assist circuit coupled to a second bit line corresponding to a second unselected memory cell, wherein the first and second unselected memory cell are coupled to the same word line as the selected memory cell.

15. The memory device of claim 14, wherein the clamp circuit comprises a first clamp circuit coupled to the first write assist circuit and a second clamp circuit coupled to the second write assist circuit.

16. A method of writing a selected memory cell, comprising:
   applying a word line signal to a word line coupled to the selected memory cell according to a row address from a control circuit;
   applying a bit line signal to a bit line coupled to the selected memory cell according to a column address from the control circuit to perform a write operation to the selected memory cell; and
   applying a clamp enable signal from the control circuit to clamp a supply voltage to other bit lines coupled to an unselected memory cell to provide a voltage boost to the word line coupled to the selected memory cell and the unselected memory cell.

17. The method of writing the selected memory cell of claim 16, wherein the unselected memory cell is coupled to the same word line as the selected memory cell.

18. The method of writing the selected memory cell of claim 6, further comprising:
   applying a control signal from the control circuit to select a portion of other bit lines to clamp to the word line coupled to the selected memory cell.

19. The method of writing the selected memory cell of claim 16, wherein the clamp enable signal couples the supply voltage to the other bit lines coupled to the unselected memory cell.

20. The method of writing the selected memory cell of claim 16, the word line coupled to the selected memory cell is pulled up due to parasitic capacitor element coupled between the word line and the other bit line coupled to the unselected memory cell.

* * * * *